US010751992B2

(12) United States Patent
Zhao

(10) Patent No.: US 10,751,992 B2
(45) Date of Patent: Aug. 25, 2020

(54) INKJET PRINTING SPRAY HEAD, INKJET AMOUNT MEASURING SYSTEM AND METHOD AND INKJET AMOUNT CONTROLLING METHOD

(71) Applicant: BOE Technology Group Co., Ltd., Beijing (CN)

(72) Inventor: Dejiang Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 55 days.

(21) Appl. No.: 16/327,093

(22) PCT Filed: May 30, 2018

(86) PCT No.: PCT/CN2018/088983
§ 371 (c)(1),
(2) Date: Feb. 21, 2019

(87) PCT Pub. No.: WO2019/056790
PCT Pub. Date: Mar. 28, 2019

(65) Prior Publication Data
US 2020/0156371 A1 May 21, 2020

(30) Foreign Application Priority Data
Sep. 22, 2017 (CN) .......................... 2017 1 0863543

(51) Int. Cl.
B41J 2/10 (2006.01)
B41J 2/135 (2006.01)

(52) U.S. Cl.
CPC .................. B41J 2/10 (2013.01); B41J 2/135 (2013.01)

(58) Field of Classification Search
CPC ....... B41J 2/10; B41J 2/035; B41J 2/06; B41J 2/07; B41J 2/095; B41J 2/205; B41J 2/12;
(Continued)

(56) References Cited

U.S. PATENT DOCUMENTS 3,769,631 A 10/1973 Hill et al.
4,333,086 A * 6/1982 Ebi ................................ 347/55
(Continued)

FOREIGN PATENT DOCUMENTS

CN 1265624 A 9/2000
CN 1612674 A 5/2005
(Continued)

OTHER PUBLICATIONS

International Search Report (including English translation of Search Report) and Written Opinion (including English translation of Box V) for International Application No. PCT/CN2018/088983, dated Aug. 1, 2018, 13 pages.
(Continued)

*Primary Examiner* — Juanita D Jackson
(74) *Attorney, Agent, or Firm* — Westman, Champlin & Koehler, P.A.

(57) ABSTRACT

An inkjet amount measuring system, an inkjet amount measuring method and an inkjet amount controlling method. The inkjet amount measuring system includes: an inkjet printing spray head; and electricity applying device configured to apply electric charges to ink droplets passing through a nozzle of the inkjet printing spray head; a magnetic field generating device configured to generate a magnetic field to deflect the charged ink droplets; a test board having a surface for carrying ink droplets; and a processor configured to calculate an amount of ink droplets according to positions of falling points of the ink droplets on the surface of the test board, an electric charge amount of the ink droplets, and a magnetic field intensity.

19 Claims, 4 Drawing Sheets

(58) Field of Classification Search
CPC ............... B41J 2/14104; B41J 2/04505; B41J 2/04526; B41J 2/04558; B41J 2002/061; B41J 2002/062
See application file for complete search history.

(56) References Cited

U.S. PATENT DOCUMENTS

| | | | |
|---|---|---|---|
| 4,881,089 A * | 11/1989 | Saito et al. | 347/55 |
| 6,511,164 B1 | 1/2003 | Bajeux | |
| 2002/0075345 A1 | 6/2002 | Shimizu et al. | |
| 2005/0093938 A1 | 5/2005 | Yang et al. | |
| 2005/0093957 A1* | 5/2005 | Gibson et al. | 347/175 |
| 2009/0153627 A1 | 6/2009 | Barbet | |
| 2009/0277980 A1 | 11/2009 | Otte | |
| 2011/0080452 A1 | 4/2011 | Britton et al. | |
| 2013/0249982 A1 | 9/2013 | Marcus et al. | |
| 2013/0314462 A1 | 11/2013 | Ikegawa et al. | |
| 2014/0225965 A1 | 8/2014 | Heuft | |

FOREIGN PATENT DOCUMENTS

| | | |
|---|---|---|
| CN | 1733483 A | 2/2006 |
| CN | 101031425 A | 9/2007 |
| CN | 101258032 A | 9/2008 |
| CN | 101354402 A | 1/2009 |
| CN | 102076501 A | 5/2011 |
| CN | 103419492 A | 12/2013 |
| CN | 103813905 A | 5/2014 |
| CN | 104203582 A | 12/2014 |
| CN | 105398218 A | 3/2016 |
| CN | 107685539 A | 2/2018 |
| JP | H01-195055 A | 8/1989 |
| JP | H02-147244 A | 6/1990 |

OTHER PUBLICATIONS

First Office Action, including Search Report, for Chinese Patent Application No. 201710863543.X, dated Nov. 5, 2018, 13 pages.

* cited by examiner

INKJET PRINTING SPRAY HEAD, INKJET AMOUNT MEASURING SYSTEM AND METHOD AND INKJET AMOUNT CONTROLLING METHOD

CROSS-REFERENCE TO RELATED APPLICATION

This application is a Section 371 National Stage Application of International Application No. PCT/CN2018/088983, filed on May 30, 2018, entitled "INKJET PRINTING SPRAY HEAD, INKJET AMOUNT MEASURING SYSTEM AND METHOD AND INKJET AMOUNT CONTROLLING METHOD", which claims priority to Chinese Patent Application No. 201710863543.X filed on Sep. 22, 2017 with CNIPA, incorporated herein by reference in entirety.

TECHNICAL FIELD

Embodiments of the present disclosure relate to the field of display technology or printing technology, and in particular, to an inkjet amount measuring system, an inkjet amount measuring method and an inkjet amount controlling method.

BACKGROUND

The use of printing methods to produce OLED products has been paid more and more attention by manufacturers, and has become the focus of development of factories. The use of inkjet printing methods to produce OLED display products has the advantages of high material utilization rate, short process time and so on.

SUMMARY

According to a first aspect of the present disclosure, there is provided an inkjet amount measuring system, comprising:
an inkjet printing spray head;
an electricity applying device configured to apply electric charges to ink droplets passing through a nozzle of the inkjet printing spray head;
a magnetic field generating device configured to generate a magnetic field to deflect the charged ink droplets;
a test board having a surface for carrying ink droplets; and
a processor configured to calculate an amount of ink droplets according to positions of falling points of the ink droplets on the surface of the test board, an electric charge amount of the ink droplets, and a magnetic field intensity.

Further, a reference position mark is provided on the surface of the test board.

Further, the electricity applying device is disposed on the inkjet printing spray head.

Further, the inkjet amount measuring system further comprises an electric field generating device configured to generate an electric field to accelerate dripping of the charged ink droplets.

Further, the surface of the test board is provided with an alignment mark.

Further, the reference position mark of the test board is one reference line or a plurality of reference lines parallel to each other.

Further, the inkjet amount measuring system further comprises an alignment lens configured to measure distances between falling points of the ink droplets and the reference position mark.

Further, the inkjet amount measuring system further comprises a windproof device configured to isolate the charged ink droplets from an external environment.

Further, the electricity applying device applies an equal amount of electric charges to all of ink droplets passing through the nozzle.

Further, the inkjet printing spray head comprises:
a cavity configured to contain ink; and
at least one said nozzle in communication with the cavity for inkjet printing.

Further, the at least one said nozzle in communication with the cavity for inkjet printing comprise a plurality of nozzles.

Further, the plurality of nozzles are arranged in one column or in a plurality of columns parallel to each other.

Further, the inkjet printing spray head comprises an alignment mark.

According to a second aspect of the present disclosure, there is provided an inkjet amount measuring method, comprising:
applying electric charges to ink droplets passing through a nozzle of an inkjet printing spray head;
generating a magnetic field and making the charged ink droplets pass through the magnetic field to deflect dripping trajectories of the ink droplets;
dripping the charged ink droplets onto a surface of a test board and recording falling points of the charged ink droplets; and
calculating an amount of ink droplets according to an electric charge amount of the ink droplets, a magnetic field intensity and positions of falling points of the ink droplets.

Further, a reference position mark is provided on the surface of the test board, distances between the falling points of the charged ink droplets on the surface of the test board and the reference position mark are recorded, and the amount of ink droplets is calculated according to the electric charge amount of the ink droplets, the magnetic field intensity and the above distances.

Further, the inkjet amount measuring method further comprises: applying an electric field to the charged ink droplets to accelerate the dripping of the ink droplets.

Further, the inkjet amount measuring method further comprises: aligning the inkjet printing spray head with the test board by using an alignment mark on the surface of the test board and an alignment mark on the inkjet printing spray head.

Further, the inkjet amount measuring method further comprises: measuring distances between falling points of the ink droplets and the reference position mark by an alignment lens.

According to a third aspect of the present disclosure, there is provided an inkjet amount controlling method, comprising:
applying an inkjet signal corresponding to a predetermined amount of ink droplets to a nozzle of an inkjet printing spray head;
applying electric charges to ink droplets passing through the nozzle;
generating a magnetic field and making the charged ink droplets pass through the magnetic field to deflect dripping trajectories of the ink droplets;
dripping the charged ink droplets onto a surface of a test board and recording falling points of the charged ink droplets;
calculating an amount of ink droplets according to an electric charge amount of the ink droplets, a magnetic field intensity and positions of falling points of the ink droplets;

comparing the calculated amount of ink droplets with the predetermined amount of ink droplets, and adjusting the inkjet signal according to a comparison result; and applying the adjusted inkjet signal to the nozzle to make the ink droplets have the predetermined amount.

BRIEF DESCRIPTION OF THE DRAWINGS

The specific embodiments of the present disclosure are further described in detail below with reference to the accompanying drawings.

DETAILED DESCRIPTION OF EMBODIMENTS

Figure 1:
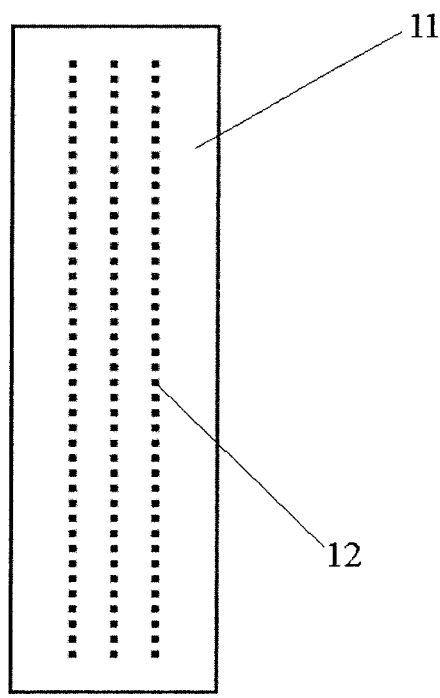
FIG. 1 is a schematic structural view of a spray head having a plurality of rows of nozzles.

In order to more clearly illustrate the present disclosure, the present disclosure will be further described below in conjunction with the optional embodiments and the accompanying drawings. Similar components in the drawings are denoted by the same reference numerals. It should be understood by those skilled in the art that the following detailed description is exemplary, but not restrictive, and should not be construed as limiting the scope of the present disclosure.

The inkjet printing method raises relatively high requirements on printing positional precision of the apparatus and volume precision of the ink. If the printing position precision is insufficient, the ink droplets cannot enter pixels. If the volume precision of the printing is insufficient, uneven display may occur. Due to difference in terms of the volume of the ink discharged, it is easy to arise uneven brightness of a display device and various mura. In order to prevent the mura, a spray head including a plurality of rows of nozzles is used. By means of a method of using a plurality of nozzles to combine ink droplets for one pixel, the volumes of the ink droplets are controlled, so as to alleviate the mura. The problem with this method is that it is difficult for the plurality of rows of nozzles to be precisely arranged on a straight line, and precise measurement of the volumes of the ink droplets is difficult.

In the method of producing an OLED product by printing, it is vital to precisely measure the volumes of the ink droplets for producing an excellent product.

Embodiments of the present disclosure provide an inkjet printing spray head, an inkjet amount measuring system and an inkjet amount measuring method for nozzles in the spray head, and an inkjet amount controlling method, in order to determine volumes of ink droplets sprayed from one or more rows of nozzles in the spray head in parallel with each other, and ensure uniformity of the volumes of the ink droplets.

As shown in FIG. 1, FIG. 1 shows a spray head of an inkjet printing apparatus. A plurality of nozzles 12 are provided on the spray head 11, arranged in a plurality of rows in a matrix. When printing, the spray head 11 is parallelly moved to print a certain film layer on an OLED display substrate, so as to print pixels of the same specification with different nozzles. Such kind of spray head facilitates averaging amount of ink in various pixels, increasing efficiency, and reducing possibility of random mura due to volume differences between different nozzles. Usually, the plurality of nozzles on the spray head in the same column have the same specification and dimension, and the droplets discharged from the plurality of nozzles are also the same in volume. However, the volume of the ink droplet discharged from each nozzle may slightly fluctuate due to various reasons. Such fluctuations may cause variations in the thickness of the inkjet printed film layer.

Figure 2:
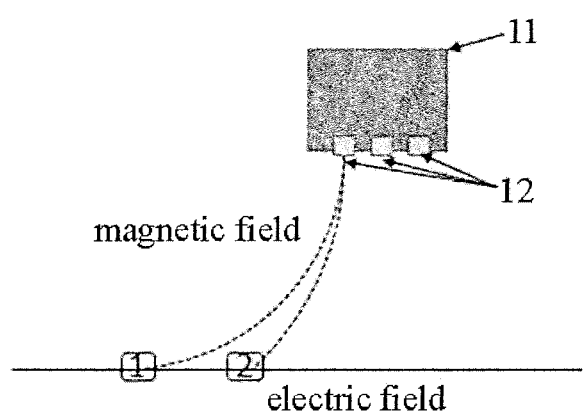
FIG. 2 is a schematic view of basic principle of an inkjet printing spray head according to an embodiment of the present disclosure.
Figure 3:
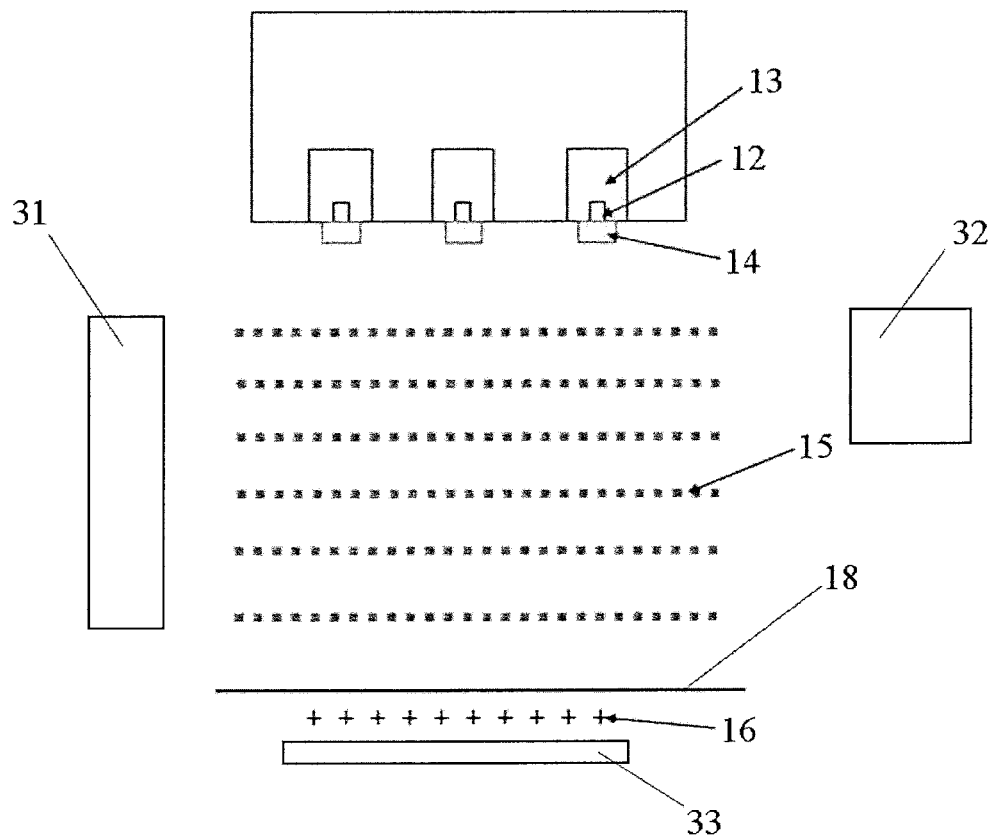
FIG. 3 is a schematic view of an apparatus according to an embodiment of the present disclosure in a test state.

As shown in FIGS. 2 and 3, a measuring system according to an embodiment of the present disclosure includes: a spray head 11 having a plurality of nozzles 12; an electricity applying device 14 for applying electric charges to ink droplets ejected from the nozzles 12; and a magnetic field generating device 31 for generating a magnetic field 15; a test board 18 having a surface for carrying ink droplets; and a processor 32 for calculating an amount of ink droplets according to positions of falling points of the ink droplets on the surface of the test board, an electric charge amount of the ink droplets, and a magnetic field intensity. The inkjet printing spray head 11 according to the embodiment of the present disclosure includes: a cavity 13 for containing ink; and a plurality of nozzles 12 in communication with the cavity 13 for inkjet printing. The plurality of nozzles 12 may be evenly disposed on the spray head 11, and the plurality of nozzles 12 are arranged in one column or a plurality of columns parallel to each other, to improve printing efficiency.

The nozzle is generally made from piezoelectric ceramic. As long as an inkjet signal is applied to the nozzle, the ink droplets can be discharged. The inkjet signal may be an inkjet voltage pulse signal. By changing the inkjet voltage pulse signal, the amount of inkjet ink droplets ejected by the nozzle and the inkjet frequency of the nozzle may be changed.

As previously described, the measuring system according to the embodiment of the present disclosure further includes an electricity applying device 14 disposed at an outlet of each nozzle for applying electric charges to the ink droplets passing through the nozzle.

Optionally, the amount of ink droplets described in the embodiment of the present disclosure refers to a volume of ink droplets calculated by a mass of ink droplets.

Electric charges are applied to the ink droplets passing through the nozzle by the electricity applying device, and the amount of electric charges applied is controlled by the pulse current provided by the electricity applying device. In this embodiment, equivalent amount of electric charges are applied the ink droplets ejected from each nozzle by the electricity applying device, so as to ensure that all the ink droplets have the same amount of electric charges, thereby improving the measurement precision.

The working principle of the inkjet amount measuring system will be described below. The charged ink droplet drips at the nozzle and enters the magnetic field. Due to the Lorentz force, the motion trajectory is deflected in comparison with the motion trajectory in case of free fall. According to the Lorentz force rule $qB=mv/r$, the charged ink droplet does circular motion in the magnetic field, and the radius $r=mv/qB$, where the magnetic field intensity B is constant, and q refers to an amount of electric charge carried by the ink droplet. If the amount of electric charge given is the same, then q is also of a constant value, and v is an initial velocity of the ink droplet, and it changes less since having a similar waveform. Therefore, as long as the radius r of the circular motion of the ink droplet is measured, the mass m of the ink droplet can be derived. Herein, m depends on the volume of the ink droplet. The larger the volume is, the larger the mass m is, and accordingly the larger the radius r is. The larger r is, the smaller the deflection amount is for the same height. Thereby, the volume of the ink droplet can be calculated according to dripping position of the ink droplet. For example, the distance between the actual dripping position of the ink droplet and the dripping position of the ink droplet in case of free fall may be used to calculate the volume of the ink droplet. For the ink droplets 1 and 2 shown in FIG. 2, when different inkjet voltage pulse signals are applied to the same nozzle, if the mass and volume of the dripped ink droplet 2 are greater than that of the ink droplet 1, then the relative offset of the ink droplet 2 on the test board is less than that of the ink droplet 1.

By utilizing the principle of deflection of charged particles in a magnetic field, the ink droplets dripped from the spray head are electrically-energized, and by adding a magnetic field and a measuring device, positions of falling points of the ink droplets ejected by different nozzles are measured, thereby calculating the volumes of the corresponding ink droplets. The method is simple and easy to implement, and the test precision is high. By comparing the calculated volume of the ink droplet with the desired volume of the ink droplet and adjusting the inkjet voltage pulse signal accordingly, the ink droplet volume of the ejected ink droplet may be precisely controlled. Applying this method to the plurality of nozzles of the spray head can increase uniformity of volume of the multiple ink droplets ejected from the spray head.

In FIG. 3, if the initial velocity of the ink droplet after entering the magnetic field is small, an external electric field 16 may be provided below the magnetic field. The direction of the electric field 16 is cooperated with the electric charge in the charged ink droplet so that the charged ink droplet is attracted, to accelerate the ink droplet in the magnetic field. In this way, it can reduce the influence of the external environment on the dripping trajectory of the ink droplet, the measurement is simple, and the test efficiency is improved. The electric field 16 may be generated by an electric field generating device 33 to accelerate the dripping of the charged ink droplet.

Figure 4:
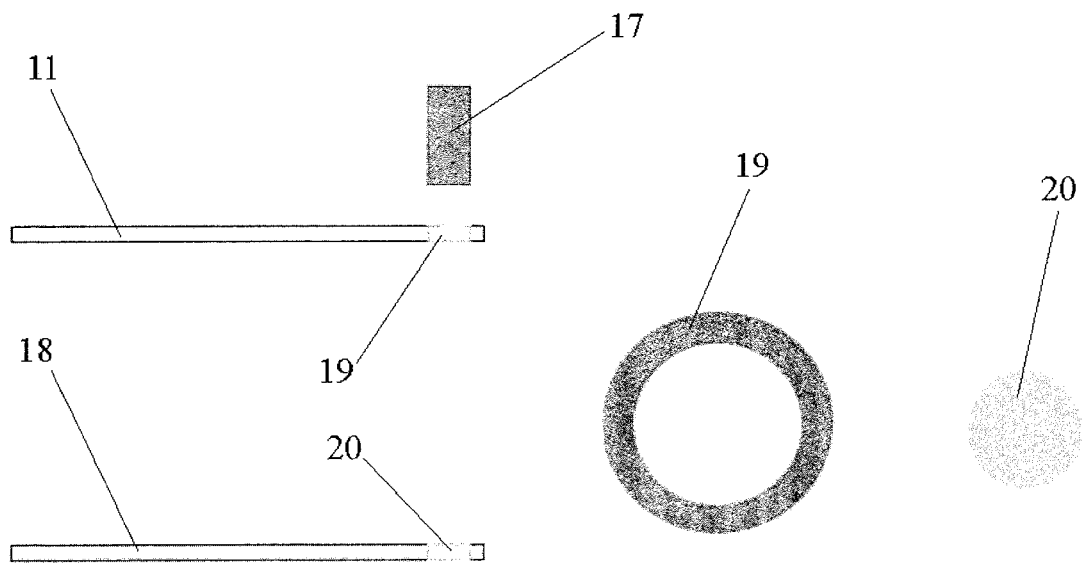
FIG. 4 is a schematic view of alignment marks according to an embodiment of the present disclosure.

As shown in FIG. 4, in order to ensure stability and collimation of the print, as well as data reliability of the plurality of nozzles in the spray head, the spray head 11 and the test board 18 need to be aligned with each other. A first alignment mark 19 is provided on the spray head 11, and a second alignment mark 20 is provided on the test board 18. The spray head 11 is aligned with the test board 18 by, for example, a CCD (Charge Coupled Device) alignment lens 17. In the embodiment according to the present disclosure, in case of test height of 3 mm to 5 mm, the alignment precision of 3 μm is ensured. A design of alignment marks is also shown in FIG. 4, in which the alignment lens 17 is disposed above the spray head 11, and a circular first alignment mark 19 is provided at a certain position of the spray head 11, and a circle second alignment mark 20 is provided on the test board 18. By moving the test board 18, the second alignment mark 20 may be just located in the first alignment mark 19, and a diameter of the second alignment mark 20 may be equal to a diameter of the inner ring of the first alignment mark 19. When the second alignment mark 20 is just filled in the inner ring of the first alignment mark 19, the spray head is successfully aligned with the test board.

By providing corresponding alignment marks on the nozzle and the test board respectively, a micron-level alignment precision can be ensured, and the ink droplets ejected from the nozzles fall with in or near to the expected position on the test board as far as possible, facilitating subsequent measurement and recording offset, and improving test efficiency and accuracy.

Figure 5:
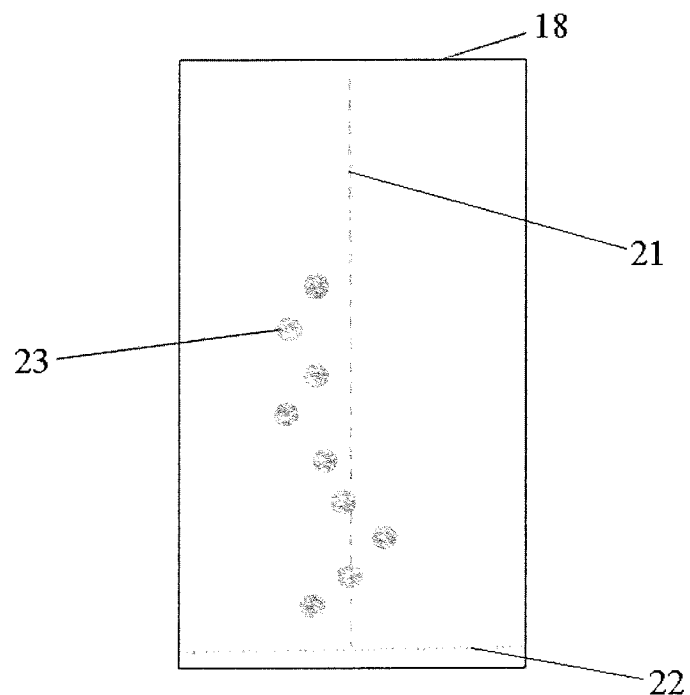
FIG. 5 is a schematic view showing offset positions of ink droplets.

After the spray head 11 and the test board 18 are successfully aligned with each other, the test is started. As shown in FIG. 5, the test board 18 is provided with reference lines 21. The number of the reference lines 21 is the same as the number of columns of the nozzles. According to the corresponding positional relationship between the alignment mark and the reference line of the test board, the test board is made into a standard test board; when the alignment is successful, the reference line may be located directly under the corresponding nozzle, or may be located at a theoretical predetermined offset position of a predetermined amount of ink droplets measured or calculated.

A standard pulse voltage waveform is applied to each nozzle to make each ink droplet undergo a sample test in a predetermined amount, then a theoretical predetermined offset is obtained by measurement and calculation. For example, in this embodiment, it describes a test procedure in which the reference line is disposed at a theoretical offset position corresponding to each column of nozzles. The standard test board is placed in parallel with the plane of the nozzles. The reference line on the standard test board is disposed parallel to the column of the nozzles. The offset of each ink droplet is determined according to a principle of proximity. The reference line that is closest to the falling point 23 of the ink droplet is considered as a reference value. It just needs to measure the offset between the corresponding ink droplet and the standard value of reference line. If there is a situation where it is impossible to determine the offset by using the principle of proximity, it may be first determined that the corresponding nozzle is abnormal.

Under normal circumstances, the offset falling point of the ink droplet should fall on the reference line. However, due to various reasons such as nozzle structure and nozzle actuation, the volumes of the ink droplets are different and thereby the qualities of the ink droplets are different, thus the positions of the falling points may be shifted, and the offsets are different. As shown in FIG. 5, provided that the charged ink droplets of a certain column of nozzles are shifted to the left by the magnetic field when dripping, and the ink droplets located on the left side of the reference line indicate that the offset is larger than the standard offset, indicating that the volumes of the ink droplets are smaller than the predetermined volume; in contrast, the ink droplets located on the right side of the reference line indicate that the offset is less than the standard offset, indicating that the volumes of the ink droplets are greater than the predetermined volume. Accordingly, the voltage pulse signal for controlling the ejection of the ink droplets may be adjusted correspondingly. The ink droplets ejected from the nozzle can be finally made to have a predetermined volume by multiple measurements and adjustments. If a scale 22 is provided on a lower part of the standard test board, the offset of each ink droplet relative to the reference line may be accurately measured, thereby obtaining the difference between the volume of the dripped ink droplet and the predetermined volume of the ink droplet visually.

By setting the reference line corresponding to each column of nozzles on the standard test board, it is possible to quickly measure the offsets of the ink droplets ejected from the nozzles arranged in one or more columns relative to the offset of standard value, and it enables simultaneous test and adjustment of the plurality of nozzles, saves test and adjustment time, improves recording, calculation and adjustment efficiency, and increases uniformity of inkjet volume of the multiple nozzles of the spray head.

Figure 6:
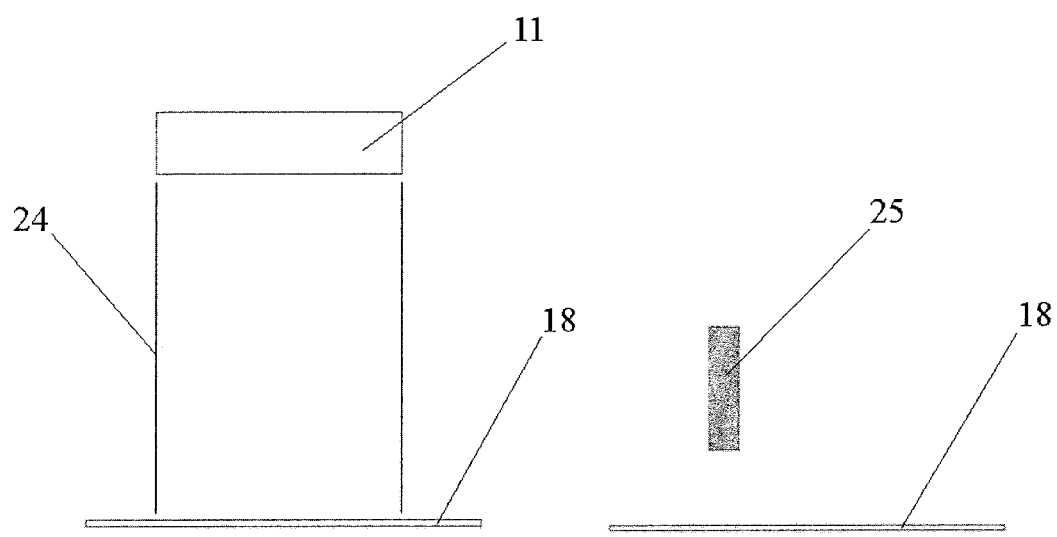
FIG. 6 is a schematic testing view of falling points of ink droplets.

According to an embodiment of the present disclosure, as shown in FIG. 6, in the whole test system, in order to ensure accuracy of test result, and prevent the ink droplets from being disturbed by the surrounding airflow during the dripping process and thereby the affection on accuracy of measurement result, a windproof device 24 is provided around the entire system. The spray head 11 and the test board 18 are both located in the windproof device 24, and the air in the windproof device is regarded as being in a non-circulating state. By providing the windproof device during the test process, the influence of external factors on the test result is reduced, the error is reduced, the accuracy of test result is improved, the uniformity of the volume of the ink droplets is ensured, and the inkjet printing precision of the apparatus is improved.

According to an embodiment of the present disclosure, after the test is completed, the test board is moved under the CCD lens (falling point scanning lens) 25. The CCD lens 25 is controlled by a robot arm, and can be moved in a three-dimensional space in an up-down direction, a left-right direction or a front-back direction. Then the scale is enlarged, the offset of the center of each ink droplet relative to the reference line is recorded, and the recording result is transmitted to the processor of the system. The processor may calculate the radius of the circular motion of the ink droplet in the above formula according to the offset of the ink droplet and the distance between the standard test board and the nozzle, and calculate mass and volume of each ink droplet according to the amount of electric charge of the ink droplet and the magnetic field intensity.

A test and adjustment method of the inkjet amount measuring system according to the embodiments of the present disclosure will be described in detail below. Specifically, an inkjet signal corresponding to a predetermined amount of ink droplets is applied to the inkjet printing spray head to eject a known amount of ink droplets; electric charges are applied to the ink droplets at the nozzles to charge the ink droplets. The charged ink droplets pass through the magnetic field below the nozzles, and are subjected to the magnetic field during the dripping process, so that the dripping trajectories are deflected relative to the dripping trajectory of free fall of the ink droplets, to do circular motion and fall onto the previously set test board. If necessary, an electric field may be applied below the magnetic field to accelerate the dripping of the ink droplets. The offset of the ink droplet on the test board is recorded by the CCD lens, and the corresponding volume of the ink droplet is calculated. After the volume of each ink droplet is obtained, it is compared with the volume of the predetermined amount of ink droplet, and the waveform of the inkjet pulse is adjusted according to the comparison result. The adjusted inkjet pulse signal is applied to each nozzle, and the above steps are repeated until all the ink droplets have a predetermined volume. That is, finally, the ink droplets ejected from each nozzle fall onto the reference line of the standard test board.

Figure 7:
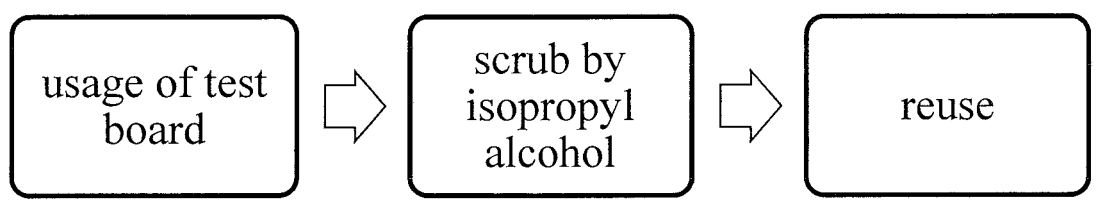
FIG. 7 is a schematic processing flow chart of a standard test board.

As shown in FIG. 7, the standard test board may be cleaned after all tests and adjustments have been completed. For example, the ink droplets on the standard test board can be scrubbed by using a volatile solvent such as isopropyl alcohol, and then dried, and then reused.

Clean and reuse of the standard test board save resources and reduce costs, and the cleaning is convenient and efficient.

The beneficial effects of the embodiments of the present disclosure are as follows:

In the technical solutions described in the embodiments of the present disclosure, the principle of deflection of the charged particles in a magnetic field is used. By adding a device for applying electric charge to the nozzles, and by adding a magnetic field and a measuring device, positions of falling points of the deflected ink droplets of different masses are calculated, thereby the volumes of the ink droplets may be figured out. According to the difference between the obtained volume of ink droplet and the ideal volume, by adjusting the inkjet voltage pulse signal and further measuring the position of falling point of the droplet, the uniformity of the volumes of ink droplets can be finally ensured, and the thickness of the film layer formed by the inkjet printing can be precisely controlled, thereby improving the inkjet printing precision of the apparatus.

It is apparent that the above-described embodiments of the present disclosure are merely exemplary of the present disclosure, but not intended to limit the present disclosure. Modifications and variations may be made by those skilled in the art to the present disclosure in different terms on the basis of the above description. It is unnecessary to list all the embodiments for the present disclosure, and the obvious modifications and variations to the technical solutions of the present disclosure still fall within the scope of the present disclosure.

What is claimed is:

1. An inkjet amount measuring system, comprising:
    an inkjet printing spray head;
    an electricity applying device configured to apply electric charges to ink droplets passing through a nozzle of the inkjet printing spray head;
    a magnetic field generating device configured to generate a magnetic field to deflect the charged ink droplets;
    a test board having a surface for carrying ink droplets; and
    a processor configured to calculate an amount of ink droplets according to positions of falling points of the ink droplets on the surface of the test board, an electric charge amount of the ink droplets, and a magnetic field intensity.

2. The inkjet amount measuring system according to claim 1, wherein a reference position mark is provided on the surface of the test board.

3. The inkjet amount measuring system according to claim 2, wherein the reference position mark of the test board is one reference line or a plurality of reference lines parallel to each other.

4. The inkjet amount measuring system according to claim 2, further comprising an alignment lens configured to measure distances between falling points of the ink droplets and the reference position mark.

5. The inkjet amount measuring system according to claim 1, wherein the electricity applying device is disposed on the inkjet printing spray head.

6. The inkjet amount measuring system according to claim 1, further comprising an electric field generating device configured to generate an electric field to accelerate dripping of the charged ink droplets.

7. The inkjet amount measuring system according to claim 1, wherein the surface of the test board is provided with an alignment mark.

8. The inkjet amount measuring system according to claim 1, further comprising a windproof device configured to isolate the charged ink droplets from an external environment.

9. The inkjet amount measuring system according to claim 1, wherein the electricity applying device applies an equal amount of electric charges to all of ink droplets passing through the nozzle.

10. The inkjet amount measuring system according to claim 1, wherein the inkjet printing spray head comprises:
 a cavity configured to contain ink; and
 at least one said nozzle in communication with the cavity for inkjet printing.

11. The inkjet amount measuring system according to claim 10, wherein the at least one said nozzle in communication with the cavity for inkjet printing comprise a plurality of nozzles.

12. The inkjet amount measuring system according to claim 11, wherein the plurality of nozzles are arranged in one column or in a plurality of columns parallel to each other.

13. An inkjet amount measuring method, comprising:
 applying electric charges to ink droplets passing through a nozzle of an inkjet printing spray head;
 generating a magnetic field and making the charged ink droplets pass through the magnetic field to deflect dripping trajectories of the ink droplets;
 dripping the charged ink droplets onto a surface of a test board and recording falling points of the charged ink droplets; and
 calculating an amount of ink droplets according to an electric charge amount of the ink droplets, a magnetic field intensity and positions of falling points of the ink droplets.

14. The inkjet amount measuring method according to claim 13, wherein a reference position mark is provided on the surface of the test board, distances between the falling points of the charged ink droplets on the surface of the test board and the reference position mark are recorded, and the amount of ink droplets is calculated according to the electric charge amount of the ink droplets, the magnetic field intensity and the above distances.

15. The inkjet amount measuring method according to claim 14, further comprising: measuring distances between falling points of the ink droplets and the reference position mark by an alignment lens.

16. The inkjet amount measuring method according to claim 13, further comprising: applying an electric field to the charged ink droplets to accelerate the dripping of the ink droplets.

17. The inkjet amount measuring method according to claim 13, further comprising: aligning the inkjet printing spray head with the test board by using an alignment mark on the surface of the test board and an alignment mark on the inkjet printing spray head.

18. The inkjet amount measuring system according to claim 1, wherein the inkjet printing spray head comprises an alignment mark.

19. An inkjet amount controlling method, comprising:
 applying an inkjet signal corresponding to a predetermined amount of ink droplets to a nozzle of an inkjet printing spray head;
 applying electric charges to ink droplets passing through the nozzle;
 generating a magnetic field and making the charged ink droplets pass through the magnetic field to deflect dripping trajectories of the ink droplets;
 dripping the charged ink droplets onto a surface of a test board and recording falling points of the charged ink droplets;
 calculating an amount of ink droplets according to an electric charge amount of the ink droplets, a magnetic field intensity and positions of falling points of the ink droplets;
 comparing the calculated amount of ink droplets with the predetermined amount of ink droplets, and adjusting the inkjet signal according to a comparison result; and
 applying the adjusted inkjet signal to the nozzle to make the ink droplets have the predetermined amount.

\* \* \* \* \*